United States Patent [19]

Shimbo

[11] Patent Number: 5,036,374
[45] Date of Patent: Jul. 30, 1991

[54] INSULATED GATE SEMICONDUCTOR DEVICE USING COMPOUND SEMICONDUCTOR AT THE CHANNEL

[75] Inventor: Masafumi Shimbo, Tokyo, Japan

[73] Assignee: Seiko Instruments Inc., Japan

[21] Appl. No.: 180,359

[22] Filed: Apr. 11, 1988

[30] Foreign Application Priority Data

Apr. 9, 1987 [JP] Japan .................. 62-87370

[51] Int. Cl.[5] ............ H01L 29/20; H01L 29/78; H01L 29/161; H01L 21/20
[52] U.S. Cl. .................. 357/23.2; 357/23.15; 357/16; 437/132
[58] Field of Search .......... 357/23.2, 23.15, 16; 437/132

[56] References Cited

U.S. PATENT DOCUMENTS

| 4,556,895 | 12/1985 | Ohata | 357/23.2 |
| 4,740,822 | 4/1988 | Itoh | 357/23.2 |

FOREIGN PATENT DOCUMENTS

| 59-119869 | 7/1984 | Japan | 357/23.2 |
| 59-232426 | 12/1984 | Japan | 437/132 |
| 60-211946 | 10/1985 | Japan | 357/23.15 |
| 60-239062 | 11/1985 | Japan | 357/23.2 |

OTHER PUBLICATIONS

IEDM Digest, Dec. 1987, #25.8, pp. 560-563 by Yamamoto et al.

*Primary Examiner*—Mark Prenty
*Attorney, Agent, or Firm*—Bruce L. Adams; Van C. Wilks

[57] ABSTRACT

An insulated gate semiconductor device comprises a channel region of compound semiconductor of one conductivity type, source and drain regions of the other conductivity type spaced apart by the channel region, a gate insulation film provided on the channel region, a gate electrode provided on the insulating film and a silicon monocrystal thin film having a thickness of 100 atoms or less inserted between the channel region and the gate insulation film.

18 Claims, 5 Drawing Sheets

INSULATED GATE SEMICONDUCTOR DEVICE USING COMPOUND SEMICONDUCTOR AT THE CHANNEL

BACKGROUND OF THE INVENTION

1. Field of the Invention

The present invention relates to insulated gate transistors using semiconductors other than Si such as compound semiconductors, for example, GaAs, etc. Accordingly, a high speed and high integrated MOS IC can be fabricated.

2. Prior Art

Transistors using compound semiconductor such as GaAs are mainly Schottky type (MES) Field Effect Transistor (FET). Recently, HEMT, HBT, etc. have been developed. Silicon is applied to insulated gate FETs, particularly MOSFETs for the use in highly integrated circuits. However, usually, compound semiconductor are not applied to MOSFET. The reason is that, in large part, a good quality insulation film such as $SiO_2$ for Si is difficult to form; in addition, there are a number of interface states in a MOS structure which use compound semiconductor. The same problems occur when Ge is used as the semiconductor.

SUMMARY OF THE INVENTION

An object of the present invention is to provide an insulated gate semiconductor device using a compound semiconductor monocrystal layer at the channel region and to decrease interface states at the interface between a channel region of compound semiconductor and a gate insulation film in such a device. This object is achieved through inserting a silicon monocrystal or single crystal silicon thin film of a thickness of 100 atoms or less between the channel region and the gate insulation film. For example, a MOSFET according to the present invention comprises a channel region of P-type GaAs, N-type source and drain regions spaced apart by the channel region, a gate insulation film provided on the channel region and a gate electrode provided on the insulating film. A silicon monocrystal thin film having a thickness of a layer of 100 atoms or less is provided between the channel region and the gate insulation film. Besides GaAs, other III-V compound semiconductors and Group IV semiconductors such as Ge can also be used.

Since the silicon monocrystal film is extremely thin, the majority of electrons or holes flow rather in the GaAs channel than in the silicon thin film, where the mobility of electrons and holes is greater than in the silicon thin film. In addition, the interface states between the channel region and the gate insulation film are considerably decreased because the interface is formed with Si and $SiO_2$. The surface potential of the channel region, namely, the threshold voltage Vth can be controlled by impurity concentration and distribution thereof in the channel region, type of the gate insulation film and thickness thereof, and type of the material of the gate electrode. Vth can also be controlled by the number of atom layers (film thickness) of the silicon thin film, conductivity type of doped impurity and the concentration thereof.

DETAILED DESCRIPTION OF THE INVENTION

The present invention is hereunder described in detail with reference to the drawings.

Figure 1A:
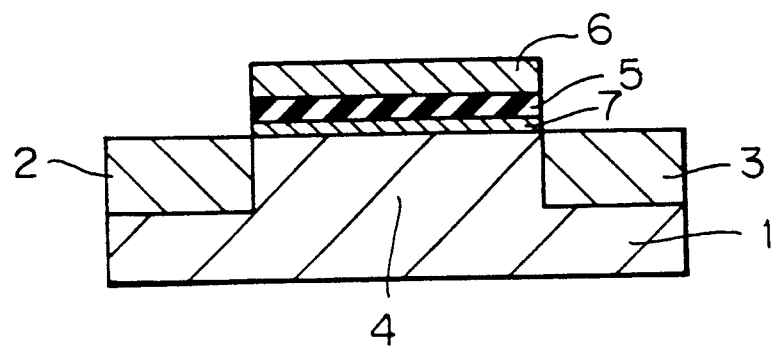
FIG. 1(a) is a sectional view of a MOSFET according to the present invention.

(1) Embodiment 1 [FIG. 1(a)]

FIG. 1(a) is a sectional view of the structure of a MOSFET according to the present invention. A P-type channel 4 is provided at the surface of a P-type GaAs layer 1. N-type source and drain regions composed of GaAs 2 and 4 are provided spaced apart by the channel. On the P-type channel region 4, an Si monocrystal thin film 7 and a gate insulation film 5 are formed, and a gate electrode 6 is provided thereon. The crystal plane of the GaAs layer 1 at the surface is not particularly defined. But it is desirable to be a crystal plane where the Si monocrystal can easily grow, for example, (100) orientation is selected. The Si thin film 7 should be as thin as possible within the controllable range, and it should desirably be a layer of a single atom to 100 atoms. $SiO_2$ and SiN can be used as the gate insulating film 5. The $SiO_2$ film can be of thermal oxide or CVD oxide film. The thickness and channel length of the gate insulation film 5 is decided according to requirements. Besides GaAs, other III-V semiconductors such as InP, and Group IV semiconductors such as Ge can also be used at the P-type channel regions 4.

Figure 1B:
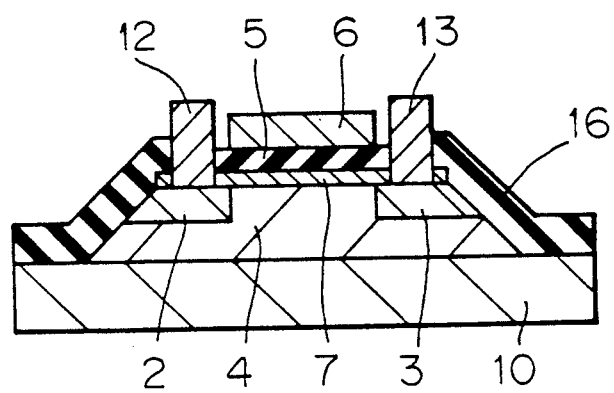
FIG. 1(b) is a sectional view of another MOSFET according to the present invention.

(2) Embodiment 2 [FIG. 1(b)]

FIG. 1(b) shows a sectional view of the structure of another MOSFET according to the present invention. In this embodiment, a P-type GaAs channel region 4 is formed in an island shape, and an Si thin film 7, a gate $SiO_2$ 5 and a gate electrode 6 are provided thereon. Source and drain electrodes 12 and 13 are provided through contact holes in a field insulation film 16. The crystal plane of the P-type Si region 10 should be so selected that GaAs monocrystal can easily grow; for example, a crystal plane with some degrees angled from a (100) plane is selected. The P-type GaAs channel region 4 can be any thickness, but typically it is $0.1\ \mu-2\ \mu$ thick.

Figure 1C:
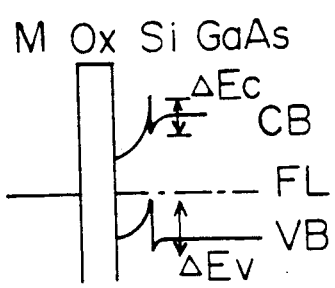
FIGS. 1(c)-(e) are energy band diagrams of MOSFETs according to the present invention.
Figure 1D:
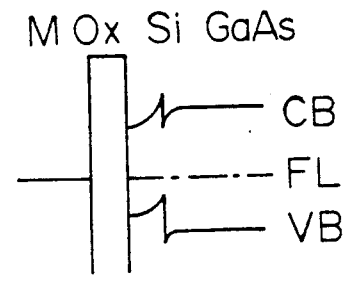
Figure 1E:
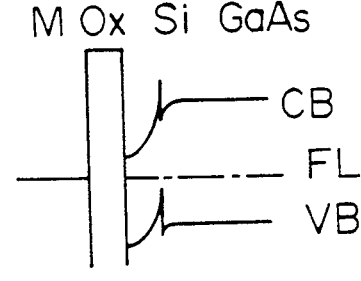

FIGS. 1(c)-(e) show typical energy band diagrams (at gate voltage=0 V) of the above embodiments. In the figure, M represents a gate electrode, OX represents a gate insulation film, CB is the conductive band, VB is the valence band and FL is the Fermi-level. Since there are differences in electron affinity and band gap between Si and GaAs, band discontinuities $\Delta Ec$ and $\Delta Ev$ occur. It is known that $\Delta Ec=$ the difference in electron affinity $=0.06$ ev occurs on the conduction band side, and ΔEv=the difference in band gap - ΔEc=0.2 eV occurs on the valence band side. FIG. 1(c) shows an energy band diagram where the impurity concentration of the Si thin film 7 provided on the P-type GaAs layer 4 is low. FIG. 1(d) shows an energy band diagram where relatively high concentration P-type impurity is doped in the Si thin film 7, which becomes more of enhancement type. FIG. 1(e) shows an energy band diagram where N-type impurity is doped in the Si thin film 7, which becomes more of depletion type. Namely, the threshold voltage Vth of this MOSFET can be controlled by conductivity type of the doped impurity and concentration thereof. In effect, as there are band discontinuities at the boundary of the Si and GaAs, a depletion layer or a potential barrier is formed at the boundary and the bands bend therefrom. Therefore, the threshold voltage Vth is also a function of the thickness of the Si thin film 7. In order to effectively use this high electron conduction in the GaAs channel region 4, the Si thin film 7 should be as thin as possible; ideally an atom layer and practically some to 100 atom layers. When the Si thin film is extremely thin, the energy state of the Si is quantized, but this does not have to be considered in this invention.

Figure 2:
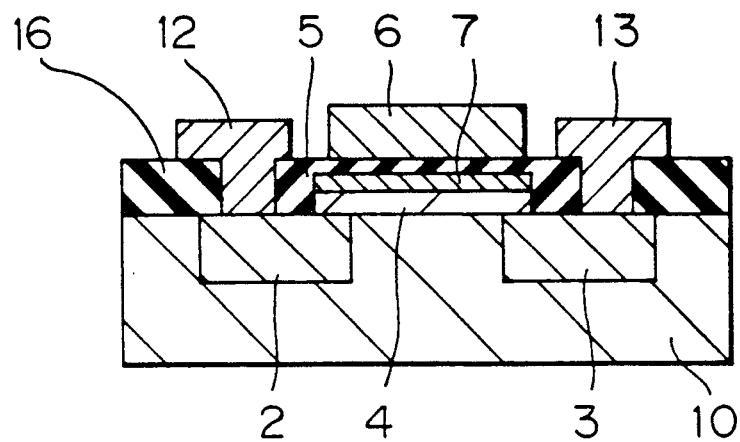
FIG. 2(a) is a sectional view of still another MOSFFET according to the present invention.
FIG. 2(b) is an energy band diagram of the MOSFET shown in FIG. 2(a), FIGS. 3(a)-(e) illustrate the fabrication process of a MOSFET according to the present invention.
Figure 2:
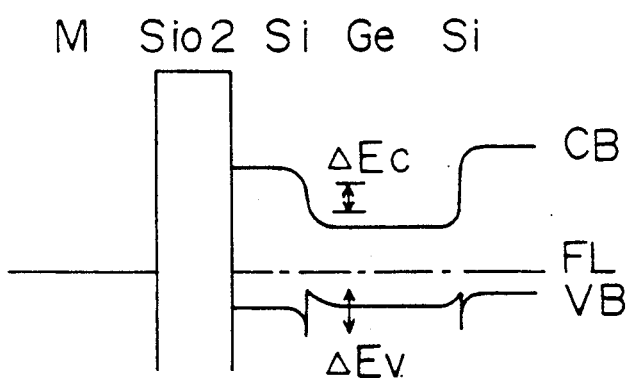

(3) Embodiment 3 [FIG. 2(a) and FIG. 2(b)]

FIG. 2(a) is a sectional view of the structure of another embodiment according to the invention, and FIG. 2(b) shows a typical energy band diagram of the embodiment shown in FIG. 2(a). A channel region 4 of the MOSFET shown in FIG. 2(a) is formed by P-type Ge. This structure comprises: N-type source and drain regions 2 and 3 formed inside a low resistance P-type Si region 10; a Ge channel region 4 formed on the P-type Si region 10 with its both ends contacting with the source and drain regions 2 and 3; and an Si thin film 7, a gate insulation film 5 and a gate electrode 6 provided thereon. FIG. 2(b) shows an energy band diagram in this structure (at Vt=0) along P-Si/P- Ge/ P- Si section. The band discontinuities are approximately ΔEc=0.12 eV, and ΔEv=0.33 eV. Therefore, in this structure, mobility of electrons through the Ge channel region 4 becomes higher, and two dimensional electron gas is likely to be formed in the Ge channel. Because of the combined effect of the high electron mobility in Ge and the formation of two dimensional electron gas, this FET operates at a very high speed. Although the above example uses Ge for the channel region 4, it is possible to use other Group IV semiconductors, e.g., SiGe mix crystal and SiC, as well as III-V semiconductors and II-VI semiconductors.

Figure 3:
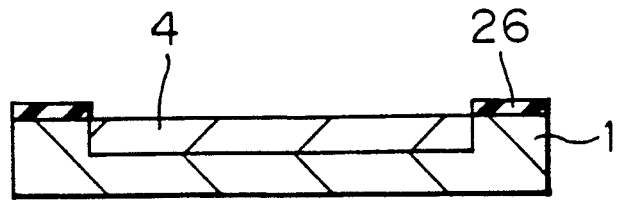
Figure 3:
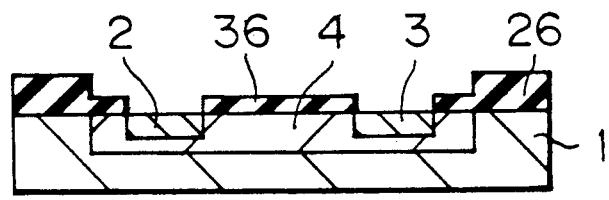
Figure 3:
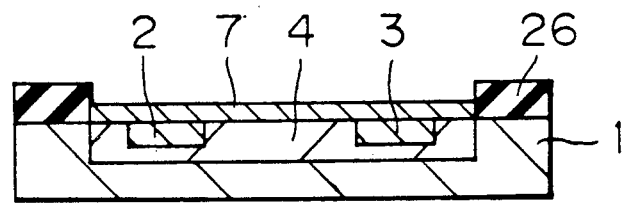
Figure 3:
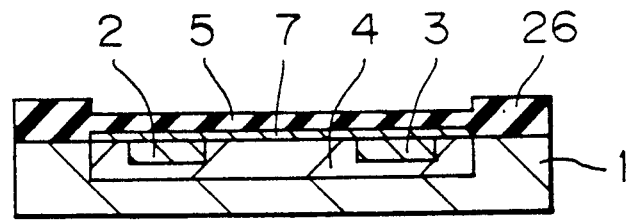
Figure 3:
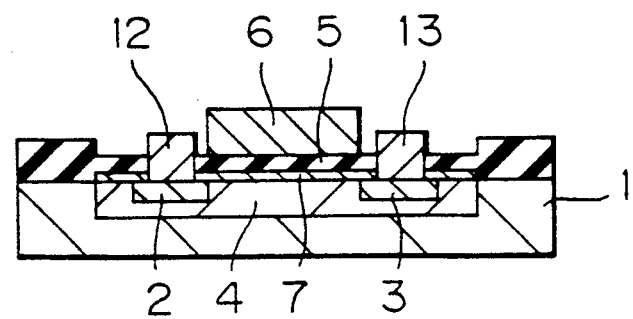

(4) Embodiment 4 [FIG. 3]

The fabrication process of a MOSFET according to the present invention is hereunder described by referring to FIGS. 3(a) to (e). FIG. 3(a) shows a section wherein a P-type GaAs channel region 4 is selectively formed on a semiinsulating GaAs substrate 1 using a CVD-SiO₂ film or the like 26 as a mask. FIG. 3(b) shows a section wherein N-type GaAs source and drain regions 2 and 3 are further provided using a CVD-SiO₂ film or the like 36 as a mask. FIG. 3(c) shows a section wherein an Si monocrystal thin film 7 is selectively grown using the SiO₂ film or the like 26 as a mask after exposing the channel region 4. Although a well known Si-H-C atmospheric or low pressure CVD method can be used to carry out this selective growth, the use of Molecular Layer Epitaxy (MLE) is more effective. Molecular Beam Epitaxy (MBE) is also effective, but selective growth is difficult in this method. FIG. 3(d) shows a section wherein a gate insulation film 5 is formed by thermal oxidization of the Si thin film 7. Of course, a CVD oxide film or CVD nitride film can be used as the gate insulation film 5. FIG. 3(e) shows a section of the finished MOSFET wherein a gate electrode 6, and source and drain electrodes 12 and 13 are formed with metal film after opening contact holes.

(5) Embodiment 5 [FIG. 4]

Figure 4A:
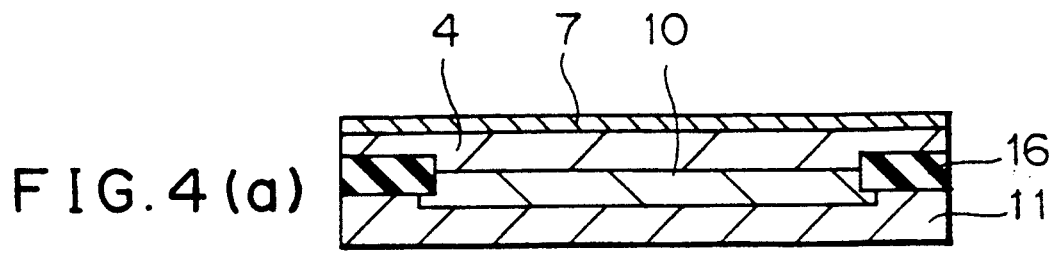
FIGS. 4(a)-(e) illustrate the fabrication process of another MOSFET according to the present invention.
Figure 4B:
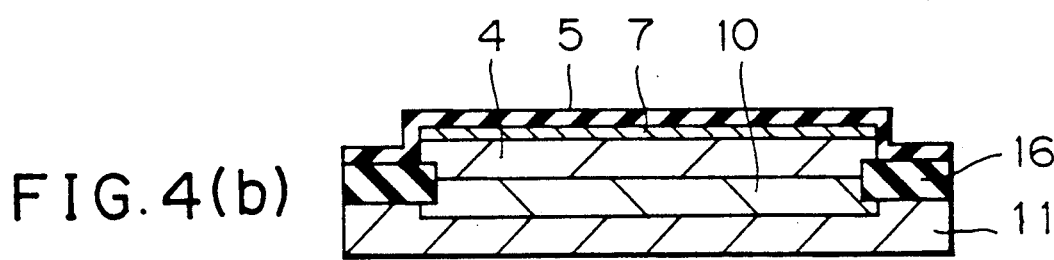
Figure 4C:
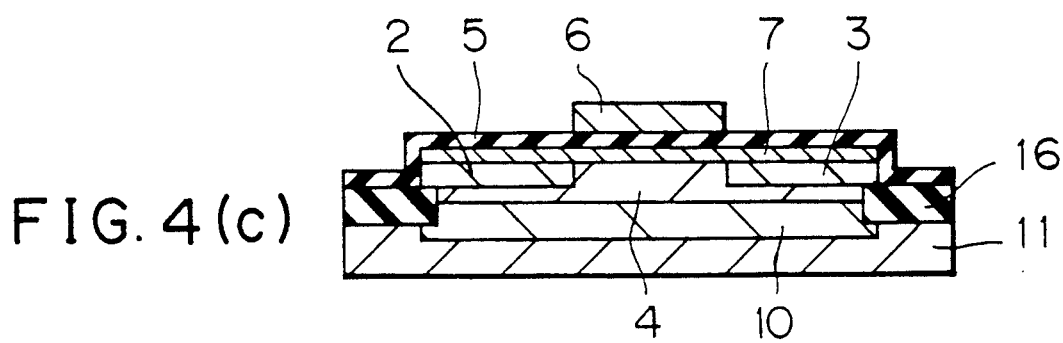
Figure 4D:
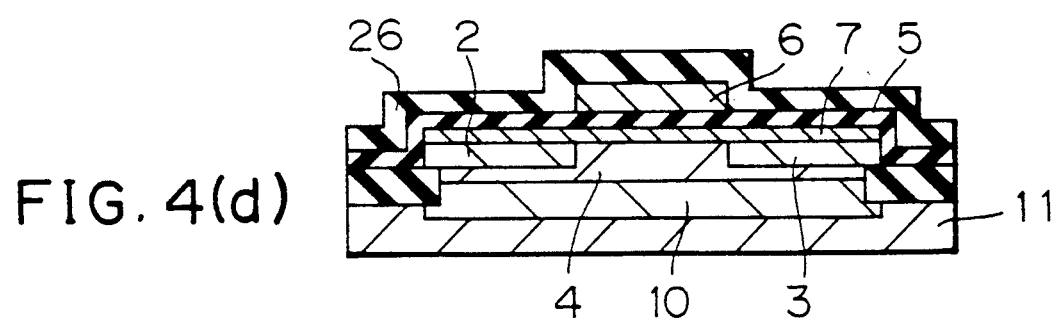
Figure 4E:
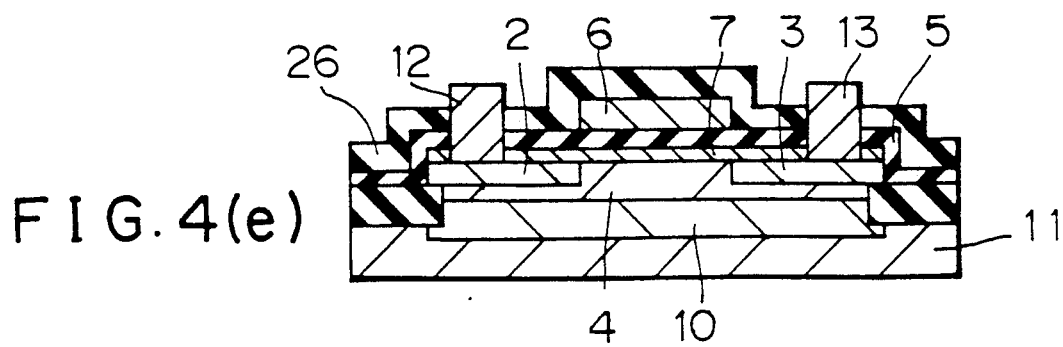

The fabrication process of another MOSFET according to the invention is hereunder described by referring to FIGS. 4(a) to (e). FIG. 4(a) shows a section wherein a P-well 10 is provided in an N-type Si substrate 11; the device isolation is carried out with a selective SiO₂ film 16; a P-type GaAs layer 4 and an Si thin film 7 are grown on the whole surface by the use of MOCVD or MBE. The GaAs layer on the P-well 10 and the Si thin film 7 are monocrystal, but other portions are composed of polycrystal. FIG. 4(b) shows a section wherein a gate insulating film 5 is deposited by the use of CVD or the like after unnecessary portions of the GaAs layer 4 and the Si thin film have been removed. FIG. 4(c) shows a section wherein after a gate electrode 6 has been formed with poly-Si, metal or silicide, N-type source and drain regions 2 and 3 are provided by ion implantation. FIG. 4(d) shows a section wherein a field insulation film 26 is deposited. Thereafter, electrodes and wirings are provided after opening contact holes thereby completing the device as shown in FIG. 4(e). It is also possible to insert a Ge thin film or a III-V superlattice layer as a buffer layer between the P-well 10 and the GaAs layer 4.

(6) Embodiment 6 [FIG. 5]

Figure 5A:
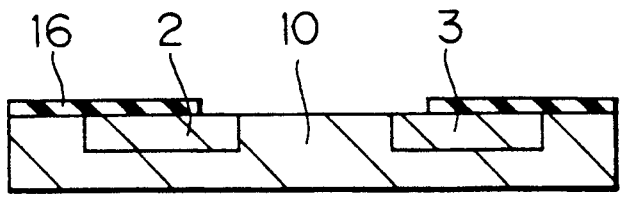
FIGS. 5(a)-(d) illustrate the fabrication process of still another MOSFET according to the present invention.
Figure 5B:
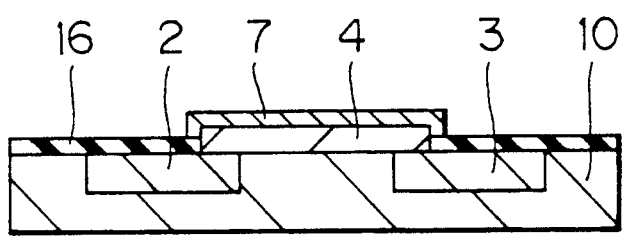
Figure 5C:
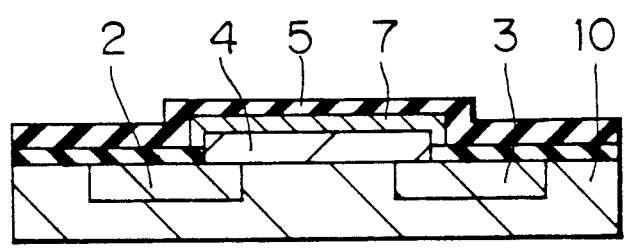
Figure 5D:
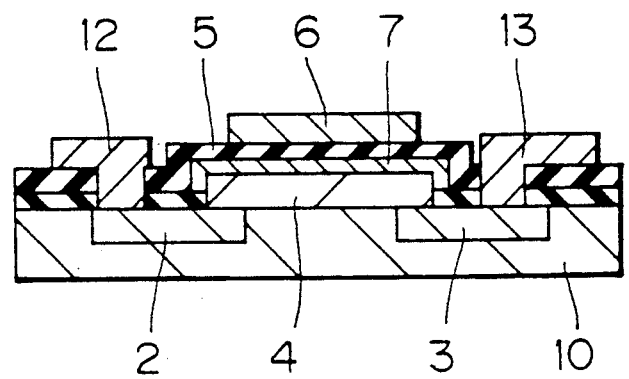

The fabrication process of a further MOSFET is hereunder described by referring to FIGS. 5(a) to (d). FIG. 5(a) shows a step wherein, after N-type source and drain regions 2 and 3 have been provided in the surface of a P-type Si substrate 10, a part of the source and drain regions and the substrate 10 therebetween are exposed using an SiO₂ film 16 as a mask. FIG. 5(b) shows a section wherein an Si thin film 7 is selectively grown after a channel region 4 composed of GaAs or Ge has been selectively formed by MOCVD or MLE using the SiO₂ film 16 as a mask. FIG. 5(c) shows a section wherein a gate insulation film 5 is deposited. FIG. 5(d) shows a section of the finished device wherein a gate electrode 6 and other parts are provided.

According to the present invention as described hereinabove, an insulated gate FET using a high electron mobility material such as GaAs and Ge, etc., at the channel region can be fabricated through the application of Si technology. Although the present invention is mainly described with reference to embodiments using GaAs and Ge, other III-V semiconductors such as InP, other Group IV mixed crystals or compound semiconductors, and II-VI semiconductors can also be used. Although, in the embodiments, N-channel type is used to describe the invention, P-channel type and depletion type FETs can also be fabricated according to the invention. Because of this feature, the present invention can also be effectively applied to CMOS. As described hereinabove, the present invention will play a major role in the fabrication of high-speed, high-integrated and multi-function ICs.

I claim:

1. An insulated gate semiconductor device comprising: a channel region having one conductivity type; source and drain regions having the opposite conductivity type spaced apart from each other by said channel region; a silicon dioxide gate insulation film provided on said channel region; and a gate electrode provided on said gate insulation film; wherein at least a part of said channel region comprises a semiconductor crystal other than silicon, and a single crystal silicon thin film less than 100 atoms thick being provided between said channel region and said gate insulation film.

2. The insulated gate semiconductor device defined in claim 1, wherein said semiconductor crystal other than silicon comprises a III-V compound semiconductor.

3. The insulated gate semiconductor device defined in claim 2, wherein said semiconductor crystal other than silicon comprises a III-V compound semiconductor formed on a substrate of Group IV semiconductor single crystal.

4. The insulated gate semiconductor device defined in claim 1, wherein the surface potential of said channel region is controlled by at least one of the film thickness, conductivity type of a doped impurity and concentration of a doped impurity of said single crystal silicon thin film.

5. The insulated gate semiconductor device defined in claim 2, wherein the surface potential of said channel region is controlled by at least one of the film thickness, conductivity type of a doped impurity and concentration of a doped impurity of said single crystal silicon thin film.

6. The insulated gate semiconductor device defined in claim 3, wherein the surface potential of said channel region is controlled by at least one of the film thickness, conductivity type of a doped impurity and concentration of a doped impurity of said single crystal silicon thin film.

7. An insulated gate semiconductor device comprising: a channel region having one conductivity type; source and drain regions having the opposite conductivity type spaced apart from each other by said channel region; a silicon nitride gate insulation film provided on said channel region; and gate electrode provided on said gate insulation film; wherein at least a part of said channel region comprises a semiconductor crystal other than silicon, and a single crystal silicon thin film less than 100 atoms thick being provided between said channel region and said gate insulation film.

8. The insulated gate semiconductor device defined in claim 7, wherein said semiconductor crystal other than silicon comprises a III-V compound semiconductor.

9. The insulate gate semiconductor device defined in claim 8, wherein said semiconductor crystal other than silicon comprises a III-V compound semiconductor formed on a substrate of Group IV semiconductor single crystal.

10. The insulated gate semiconductor device defined in claim 7, wherein the surface potential of said channel region is controlled by at least one of the film thickness, conductivity type of a doped impurity and concentration of a doped impurity of said single crystal silicon thin film.

11. The insulated gate semiconductor device defined in claim 8, wherein the surface potential of said channel region is controlled by at least one of the film thickness, conductivity type of a doped impurity and concentration of a doped impurity of said single crystal silicon thin film.

12. The insulated gate semiconductor device defined in claim 9, wherein the surface potential of said channel region is controlled by at least one of the film thickness, conductivity type of a doped impurity and concentration of a doped impurity of said single crystal silicon thin film.

13. An insulated gate semiconductor device comprising: a channel region having one conductivity type with at least a part of said channel region comprising a semiconductor crystal not including silicon; a source region of the opposite conductivity type; a drain region of the opposite conductivity type spaced apart from the source region by said channel region; a gate insulation film on said channel region composed of silicon dioxide or silicon nitride; a gate electrode on said gate insulation film; and a single crystal silicon thin film having a thickness less than 100 atoms disposed between said channel region and said gate insulation film.

14. The insulated gate semiconductor device defined in claim 13, wherein said semiconductor crystal not including silicon comprises a III-V compound semiconductor.

15. The insulated gate semiconductor device defined in claim 13, wherein said semiconductor crystal not including silicon comprises a III-V compound semiconductor formed on a substrate of Group IV semiconductor single crystal.

16. The insulated gate semiconductor device defined in claim 13, wherein the channel region has a surface potential controlled by at least one of the film thickness, conductivity type of a doped impurity and concentration of a doped impurity of said single crystal silicon thin film.

17. The insulated gate semiconductor device defined in claim 14, wherein the channel region has a surface potential controlled by at least one of the film thickness, conductivity of a doped impurity and concentration of a doped impurity of said single crystal silicon thin film.

18. The insulated gate semiconductor device defined in claim 15, wherein the channel region has a surface potential controlled by at least one of the film thickness, conductivity type of a doped impurity and concentration of a doped impurity of said single crystal silicon thin film.

* * * * *